United States Patent [19]
Buice et al.

[11] Patent Number: 5,595,330
[45] Date of Patent: Jan. 21, 1997

[54] POWER SUPPLY

[75] Inventors: David Buice, Dallas; Cesar Alfaro, Carrollton; Mike Whelan, Coppell, all of Tex.

[73] Assignee: Verity Instruments, Inc., Carrollton, Tex.

[21] Appl. No.: 295,992

[22] Filed: Aug. 24, 1994

[51] Int. Cl.$^6$ .................................................. B23K 20/10
[52] U.S. Cl. ........................................ 228/102; 228/110.1
[58] Field of Search ................................. 228/110.1, 1.1, 228/102

[56] References Cited

U.S. PATENT DOCUMENTS

| | | | |
|---|---|---|---|
| 4,696,425 | 9/1987 | Landes | 228/110.1 |
| 4,993,618 | 2/1991 | Toyozawa et al. | 228/102 |
| 4,998,664 | 3/1991 | Gibson et al. | 228/102 |
| 5,046,654 | 9/1991 | Yamazaki et al. | 228/102 |
| 5,213,249 | 5/1993 | Long et al. | 228/1.1 |
| 5,314,105 | 5/1994 | Farassat | 228/110.1 |
| 5,433,369 | 7/1995 | Okumura | 228/110.1 |

*Primary Examiner*—P. Austin Bradley
*Assistant Examiner*—Jeffrey T. Knapp
*Attorney, Agent, or Firm*—Arthur F. Zobal

[57] ABSTRACT

The power supply includes a voltage controlled oscillator, two potentiometers and a by-pass circuit coupled to the output of the voltage controlled oscillator. The two potentiometers form two channels, channel 1 and channel 2, one of which will be selected during the bonding cycle to be coupled to a power amplifier. The output of the power amplifier is adapted to be coupled to an ultrasonic transducer for operating the transducer. Selectable channel 1 and channel 2 reference voltage devices are provided. The voltage and current applied to the amplifier are converted to power. During a bonding cycle, a comparator compares the power applied to the transducer with that of a selected reference voltage and varies the output of the potentiometer of the selected channel to maintain the output of the power amplifier constant during bonding. Also provided is a switching arrangement for coupling the by-pass circuit to the power amplifier at the initial part of a bonding cycle and for coupling the potentiometers the selected channel 1 or channel 2 to the power amplifier such that a maximum burst of energy is applied to the transducer initially during the bonding cycle and then the desired voltage level from the selected channel 1 or channel 2 is applied to the transducer.

4 Claims, 4 Drawing Sheets

FIG. 6
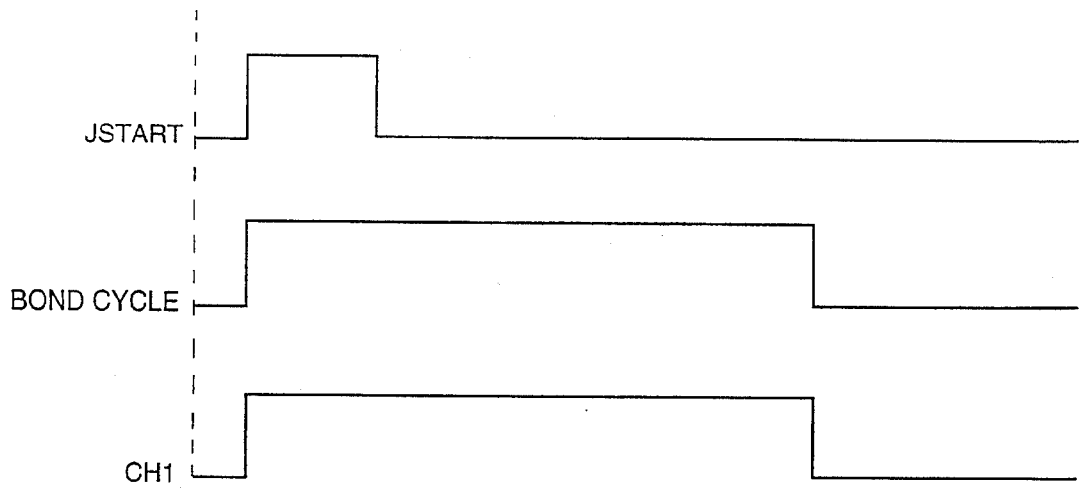
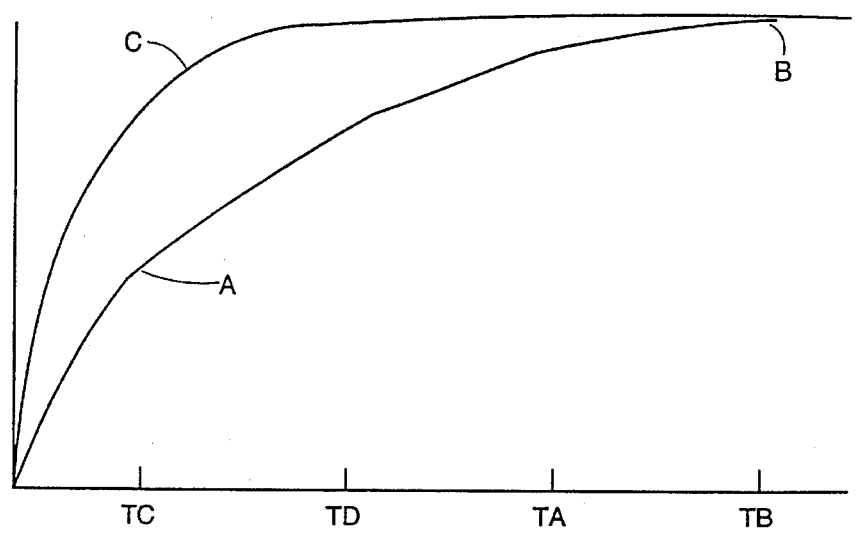
FIG. 5

POWER SUPPLY

BACKGROUND OF THE INVENTION

1. Field of the Invention

The invention relates to a power supply for use for operating an ultrasonic transducer for carrying out welding or bonding operations on circuits such as integrated circuits.

2. Description of the Prior Art

Ultrasonic transducers for welding purposes have been employed for many years as exemplified by U.S. Pat. Nos. 3,054,309; 5,201,454; and 5,244,140 which are incorporated herein by reference. The transducers generally are formed of stainless steel and have a welding end for supporting a welding tool for holding a wire to be welded to an integrated circuit (IC) or to a carrier package. The opposite end supports a source such as a piezoelectric ceramic crystal device for causing the body to vibrate at a desired frequency for welding purposes. A mount is provided for supporting the transducer and the piezoelectric crystal device is driven by a power supply for operating the transducer for a given bonding cycle.

Problems have occurred in that parameters such as temperature and the force exerted on the bond pad including clamping forces change which causes the impedance of the transducer to change. If the impedance increases, the power to the transducer decreases which decreases the quality of the weld resulting in an unreliable IC. The impedance changes also can also be caused by long term drift changes in the piezo material characteristics, chemical composition of the bonding surface, bonding wire type, bonding wire material transducer mounting torque variations, bonding tool size and type, bonding tool installation variations, bonding site tool contact pressure during bonding, variations in the formation of inter metallic chemistry at the bond site during bonding, and variations in the bonding ball size.

It also has been found that the conventional bonding cycle is not fast enough and that the IC can be subjected to heat for an extended period which can result in damage to the IC.

SUMMARY OF THE INVENTION

It is an object of the invention to provide a constant power source and method for operating an ultrasonic transducer which maintains the electrical power to the transducer constant thereby increasing the quality of the bond even though the characteristics of the piezoelectric crystal may vary.

It is another object of the invention to provide a power supply and method for operating an ultrasonic transducer to allow bonding to be carried out in a more rapid time period thereby minimizing the heat applied to the IC during bonding.

The power supply for producing a constant voltage output to the transducer comprises a voltage controlled oscillator and a variable voltage producing means coupled to the voltage controlled oscillator for producing a voltage at different levels. In addition a power amplifier is provided having an input coupled to variable voltage producing means and an output to be coupled to the transducer. Means also is provided for producing a reference voltage. A comparator circuit compares the output power of the power amplifier to the reference voltage and produces an output for application to the variable voltage producing means for varying the voltage to the power amplifier in a manner to maintain its power output to the transducer constant.

The circuitry for decreasing the bonding time comprises a by-pass circuit and control means for initially coupling the by-pass circuit from the output of the voltage controlled oscillator to the input of the power amplifier and then for coupling the variable voltage producing means from the output of the voltage controlled oscillator to the input of the power amplifier whereby a burst of energy initially is applied to the transducer at the beginning of the bond cycle in order to decrease the ramp time of the transducer and then to allow the desired voltage to be applied to the transducer for bonding purposes.

BRIEF DESCRIPTION OF THE DRAWINGS

FIG. 5 illustrate waveforms produced by components of the power supply of FIGS. 4A and 4B.

FIG. 6 illustrate the ramp time of an ultrasonic transducer during a bond cycle.

DESCRIPTION OF THE PREFERRED EMBODIMENTS

Figure 1:
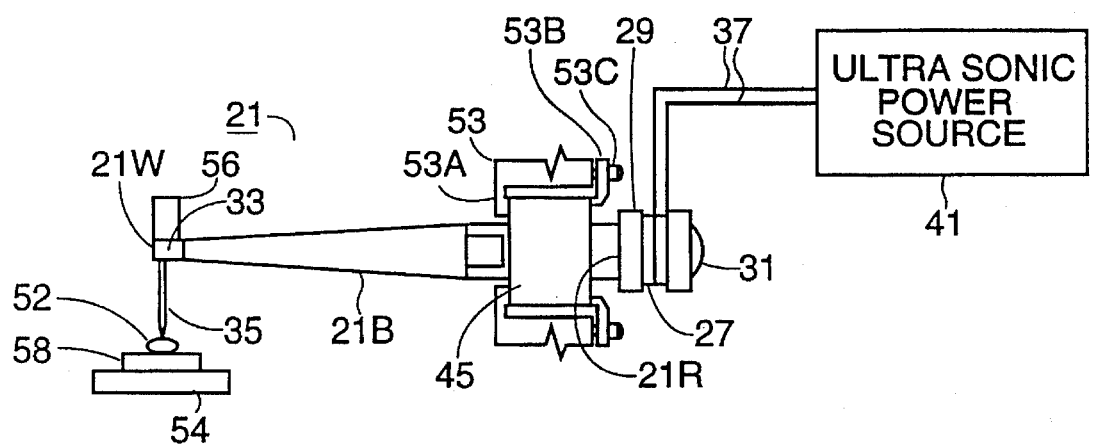
FIG. 1 illustrates an ultrasonic transducer, a mount for the transducer and a power supply coupled to the piezoelectric crystals of the transducer.
Figure 2:
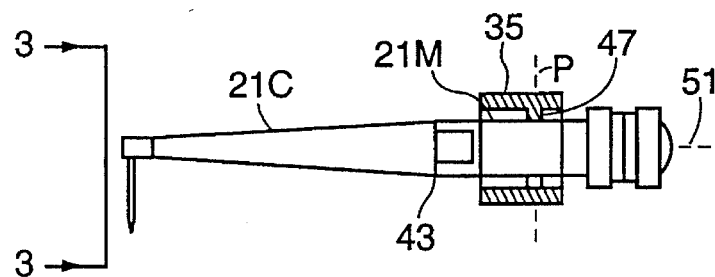
FIG. 2 illustrates a cross section of the mount of FIG. 1 coupled to the transducer.
Figure 3:
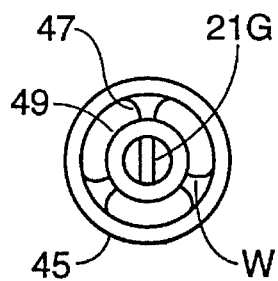
FIG. 3 is an enlarged view of the transducer of FIG. 2 as seen from lines 3—3 thereof with the welding tip removed.

Referring now to FIGS. 1–3, an ultrasonic transducer is identified by reference number 21. It comprises a stainless steel body 21B having a welding end 21W and an opposite end 21R for supporting a source which in the embodiment disclosed, is a piezoelectric ceramic crystal device 27 for causing the body to vibrate at a desired frequency for welding purposes. The crystals 27 are annular members held between two washers 29 which are connected to the rear end 21R of the body 21B by a bolt 31 screwed into a threaded aperture(not shown) extending into the end 21R of member 21B. The welding end 21W has a gap 21G leading to an aperture 33 formed therethrough for receiving a welding tip 35 which is secured therein by a set screw (not shown). The welding tip may be a capillary for holding the wire to be bonded to form a ball bond or a tool for holding the wire to form a wedge bond. Electrical leads 37 are connected to the crystals and to a high frequency electrical source 41 for actuating the crystals 27 for producing a voltage at the desired level and at the desired frequency.

The transducer body 21B is solid and has a cone shaped portion 21C from end 21W to position 43 with a stainless steel cylindrical mount 45 secured to the body portion 21M between position 43 and the crystals 27. As shown in FIG. 3, the cylindrical mount 45 is spaced from the body 21B substantially 360 degrees around the cylindrical body portion 21M by three stainless steel spokes 47 located in the same plane and which extend from the body portion 21M to the inside of the cylindrical mount 45. The centers of adjacent spokes are spaced 120 degrees apart. Arcuate gaps 49 extend between adjacent spokes 47, body portion 21M, and the inside of the cylinder 45. The spokes 47 provide an electro-mechanical restrictive path that isolates the transducer vibrating body from the mounting or holding assembly. The electromechanical isolation technique achieves two objectives; first, it provides a mechanical resistance that isolates the ultrasonic energy generated by the piezo ceramic crystals or motor stack and thus improves operating efficiency, and second, it beneficially stabilizes electrical parameters, presenting a transducer load which is easier to control at the generating source.

To further improve transducer performance, the thin contacts or spokes are aligned to the acoustical vibrating node of the operating frequency forcing the vibratory(ultrasonic) energy to be transferred directly from the motor stack (piezo stack) to the welding tip. This is done by locating the spokes 47 at the node or point of minimal wave motion along the length of the transducer body.

In FIG. 1 two removable clamps 53 are shown connected to the mount 45 for supporting the mount 45 and transducer 21 to structure of the welding system. Each clamp 53 comprises a hook shaped member 53A coupled to one end of the cylinder 45 and to a L-shaped member 53B which is coupled to the other end of the cylinder 45 and to member 53B by a bolt 53C. The transducer of FIGS. 1-3 is disclosed in co-pending U.S. patent application Ser. No. 08/148,285, filed Nov. 8, 1993.

In FIG. 1, the transducer 21 is illustrated as bonding a wire 52 to a bond site 58 of an integrated circuit 54. The wire 52 may be gold and the bond site 58 may be aluminum. Member 56 is a pressure source for applying pressure to the transducer.

Figure 4A:
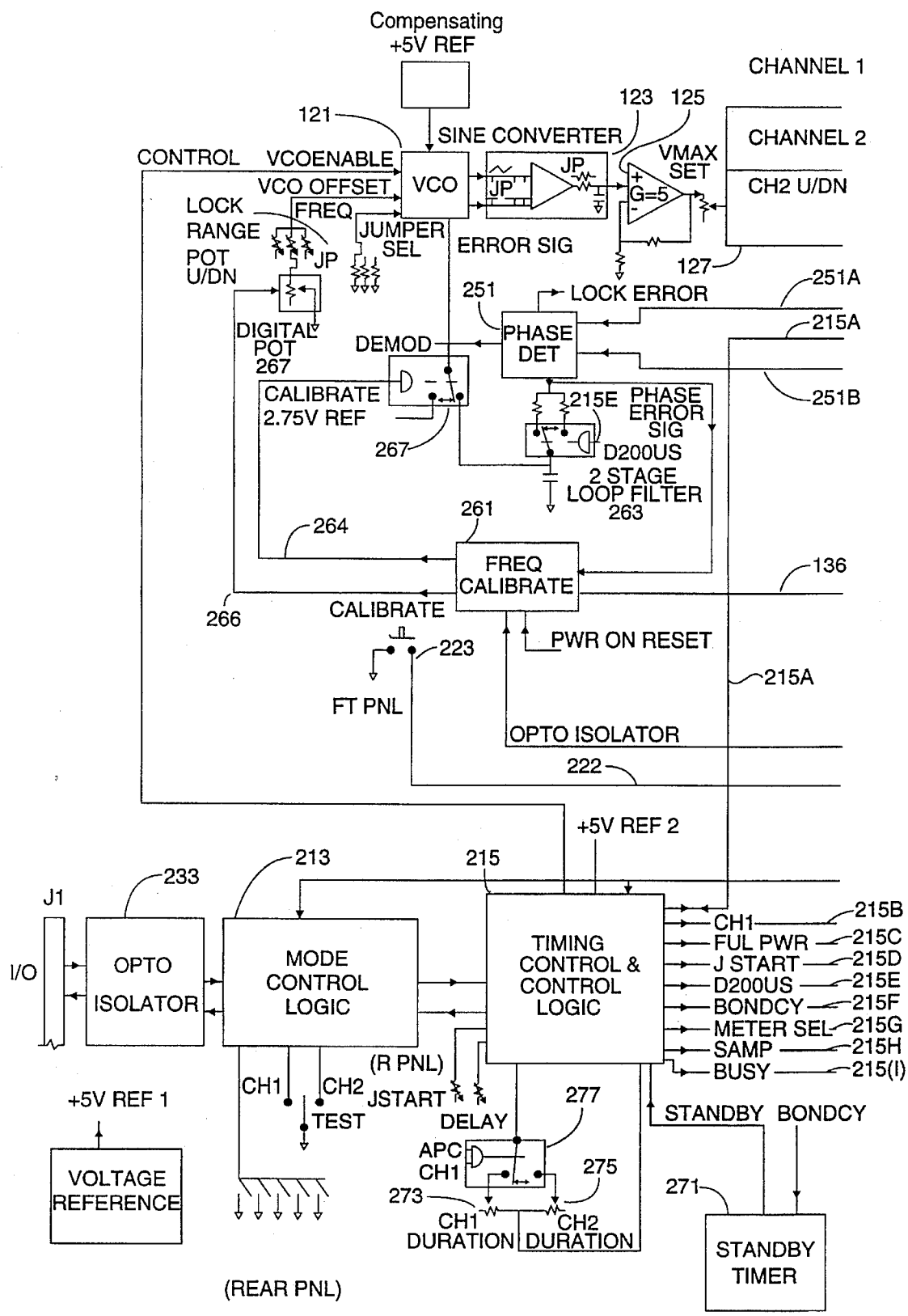
FIGS. 4A and 4B is a block diagram of the power supply of the invention. The complete circuitry of the power supply can be viewed by placing the right edge of FIG. 4A next to the left edge of FIG. 4B.
Figure 4B:
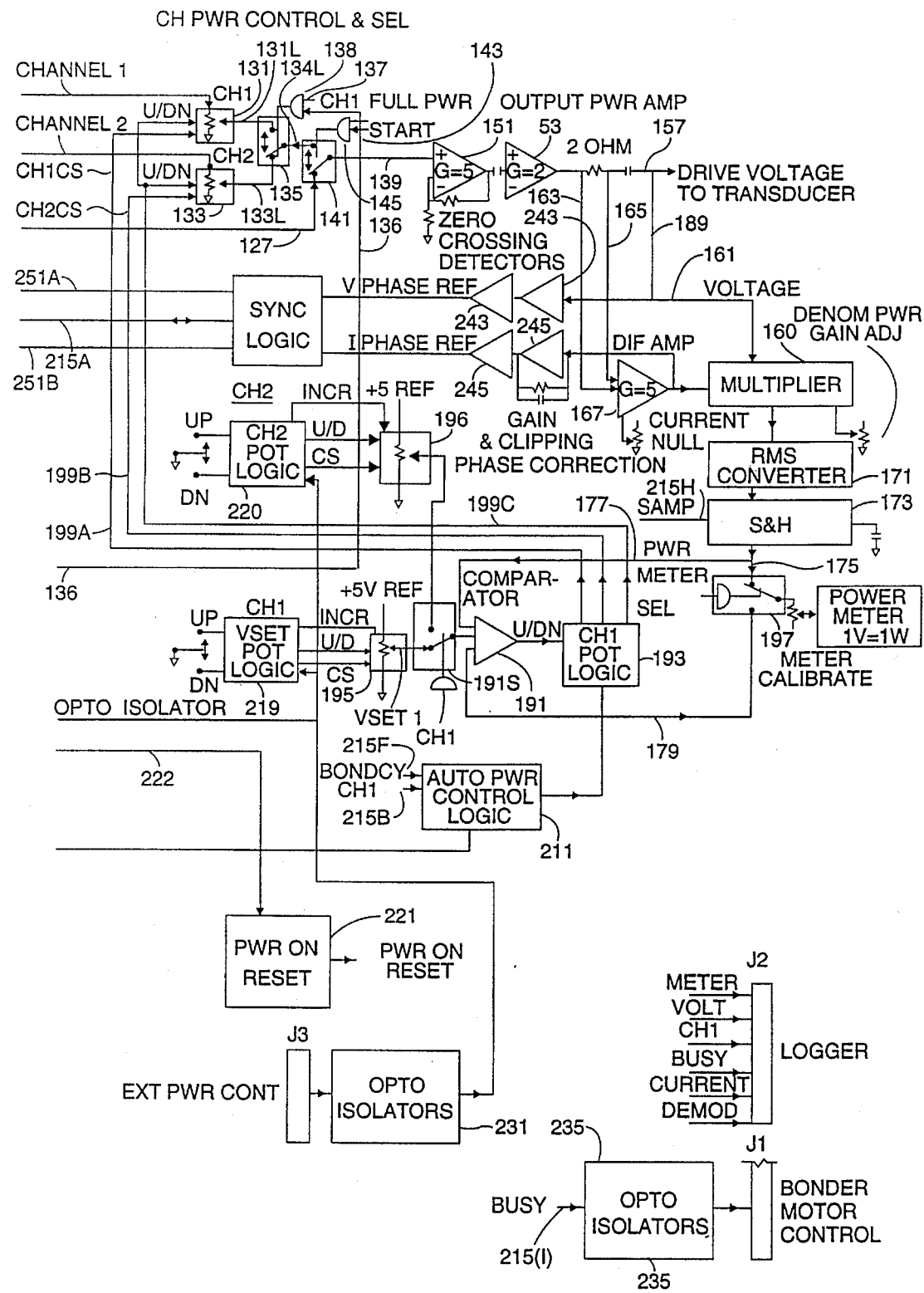

Referring now to FIGS. 4A and 4B the drawings, there will be described the power supply of the invention. A voltage controlled oscillator 121 periodically produces a square wave at a frequency which may be between 50 KHz and 5.0 MHz for operating the ultrasonic transducer for bonding or welding purposes. The square wave is converted to a sine wave by circuitry 123 whose output is amplified by amplifier 125 to a level sufficient to drive the transducer the output of the amplifier is applied to a by-pass lead 127 and to channel 1 and channel 2. Potentiometers, 131 and 133 of channels 1 and 2, are digital potentiometers and can be adjusted electronically to control the power level for each channel. During bonding, one of the channels will be coupled to the transducer for operating the transducer. Channel 1 is used for bonding electrical leads to silicone chips and channel 2 may be used for the same purpose or to bond electrical leads to the main frame. When either channel 1 or channel 2 is selected, the power to the transducer is maintained constant with the use of preset reference voltages, a comparator, and feedback circuitry. When either channel is selected, the power to the transducer will be compared to the preset reference voltage for that channel and the potentiometer 131 of channel 1 (or 133 of channel 2) will be adjusted up or down to maintain its output power level constant.

Switches 135 and 141 are electronic switches. Switch 135 provides conduction from lead 133L to lead 134L such that the output of channel 2 passes through the switch. When switch 135 is actuated by full power and CH1 signals on leads 136 and 137 of AND gate 138, conduction will be through the switch 135 from lead 131L to lead 134L such that the output of channel 1 passes through the switch. Switch 141 provides conduction from lead 127 to lead 139, such that the output of the amplifier 125 passes by way of the by-pass lead 127 to lead 139 ,by-passing channels 1 and 2. Lead 139 is coupled to power amplifier 151 which is coupled to power amplifier 153 the latter of which is coupled to a 2 ohm resistor 155 and then to lead 157 which applies the voltage drive to the transducer. When switch 141 is actuated by full power and start signals on leads 136 and 143 of AND Gate 145, conduction through switch 141 is from lead 134L to lead 139 whereby the output from the selected channel 1 or 2 will be applied to lead 139 and to the transducer. The maximum voltage peak to peak that can be applied to the transducer in one embodiment is 26 volts. The bonding voltage applied to the transducer as determined by the potentiometers 131 or 133 is between 26 volts and 4 volts peak to peak. If channel 1 or channel 2 is to be selected, full power will be applied to the transducer for a short period of about 200 to 800 microseconds and when the jump start signal is produced, the switch 141 will be actuated to allow reduced power from potentiometer 131 or potentiometer 133 to be applied to the transducer. The total bonding time period may be between 1 millisecond and 500 milliseconds. Thus at the beginning of the bond cycle, a burst of maximum energy is applied to the transducer which energy then tapers down to the programmed power that is set by the potentiometers 131 or 133 of channels 1 or 2. The normal ramp time of the transducer from zero to a position where maximum power is applied to the transducer is illustrated by portion A of the curve B of FIG. 5. This time may be 8 milliseconds with the bonding time occurring between times Ta and Tb which may be 2 milliseconds. Thus the total bonding cycle in this case is at least 10 milliseconds. By applying the burst of energy to the transducer at the beginning of the bond cycle, the ramp time decreases and the transducer reaches full power in a much shorter period, as shown at time Tc in FIG. 6 of curve portion C with the two milliseconds bonding time occurring between Tc and Td.

Thus as can be understood, the same bonding time can be obtained at an earlier period in the bond cycle thereby allowing more welds to be achieved in a given time period and decreasing the heat applied to the IC during bonding resulting in more welds being achieved with better quality in the bond. The jump start power allows one to compensate for the mechanical lag or resistance that the transducer has by design. Inherent problems of an ultrasonic transducer is that it is very slow to respond to acoustical signals. In order to compensate for that lag problem, a maximum burst or power is applied to the transducer to get it started very quickly so the ramp time of the transducer reaches maximum power in a shorter time than if the ultimate desired power was applied to the transducer over the entire bonding cycle. This allows the operator to do welding or bonding in a shorter time than normal bonding and hence allows more circuits to be welded in a given time period. In addition, it enhances the quality of the weld, since the circuit being welded will be subjected to the heat and power of the welding system for a shorter period of time. At the beginning of the bond cycle, channels, 1 and 2 are bypassed to obtain full power to the transducer. When the switch 141 is actuated and when switch 135 is in the condition shown or is actuated by the CH1 signal, channel 1 or channel 2 is selected and the potentiometer 131 of channel 1 or the potentiometer of channel 2 will divide down the voltage applied thereto to the desired welding voltage.

The voltage to the transducer is applied by leads 159 and 161 to a multiplier 160. Current is measured by measuring the voltage across the resistor 153. The voltage across the resistor 153 is applied by way of leads 163 and 165 to a differential amplifier 167 whose output is applied to the multiplier 160. The multiplier 160 converts the current and voltage applied thereto to power. The multiplier 160 is an IC electronic multiplier and the output is peak to peak power. The output of the multiplier 160 is applied to a root mean square circuit 171 which converts the peak to peak power to root mean square value or average real power. The output of RMS 171 is applied to a sample and hold circuit 173. The sample and hold circuit converts the pulse output of the RMS circuit 171 to a continuous signal and it holds the signal during the period that the signal is not present. It act as a storage device. It samples the power level during the pulse and holds it until the next pulse. If the next pulse is too low or too high, the system will force the power to increase or decrease to obtain a constant power. Thus the sample and hold samples and holds the power level. The output of the sample and hold is applied to a power meter 181 by way of lead 175 and switch 197 and by way of lead 177 to a comparator 191. The power meter produces a continuous visual reading of the power being applied to the transducer. The comparator 191 compares the real power from the sample and hold 173 to a preset power. Leads 177 and 179 are coupled to the comparator 191 whose output is coupled to a pot logic 193. The pot logic 193 generates CH1 and CH2 signals which are applied to pots 131 and 133 by way of leads 199A and 199B respectively. The pot logic 193 also produces a up/down signal which is applied to pots 131 and 133 by way of lead 199C. The CH1 signal will allow the up/down signal to control pot 131 only and the CH2 signal will allow the-up/down signal to control pot 133 only. A reference preset voltage is obtained from a digital potentiometer 195 or a digital potentiometer 196 one of which is selected by a switch 191S for application of its output to the comparator 191. A CH1 signal applied to switch 191S normally controls the switch 191S to apply the output of logic 219 to the comparator 191 such that power to the transducer when channel 1 is selected (after switch 141 is actuated to disconnect the by-pass lead 127), is maintained constant. The power level of the preset power is adjusted by the operator to a level based on previous bonding operations. Assume that channel 1 is selected for bonding purposes. The power level of the preset power is adjusted by manually operating the up down switch of a channel 1 voltage set potentiometer logic 219 which applies to the potentiometer 195, a chip select signal to enable the potentiometer, an up down signal, and an increment signal to change the level of the potentiometer 195. When the power is not being used for bonding, the preset power is fed to lead 179 and switch 197 controlled by a meter select signal applies the preset power to the power meter 181 which can be visually observed by the operator. When bonding is being carried out, the switch 197 will apply the voltage on lead 175 to the meter 181 and allow the real power to be displayed by the meter. In addition, during bonding, the comparator 191 will compare the real power applied to the transducer to the preset power from circuit 195 and apply its output to the channel 1 potentiometer logic 193 which produces a CH1 signal and control signal which are applied to the potentiometer 131 by way of leads 199A and 199C for controlling the output of potentiometer 131. If the real power is greater than the preset power, the output of the comparator goes low and controls the logic 193 to produce a signal which is applied to the potentiometer 131 by way of lead 199C to increment the output of potentiometer 131 down, which lowers the power applied to channel 1 and hence the power applied to the transducer. If the real power is lower than the preset power, the output of the comparator goes high and controls the logic 193 to produce a signal which is applied to potentiometer 131 of channel 1 to cause the potentiometer 131 to raise the power of channel 1 and hence the power applied to the transducer.

The digital potentiometer 195 in the comparator system has a built in nonvolatile memory so when the operator turns the power off, the next time the system is turned on, the preset power will come back to where it was at the time that it was last turned on.

An auto power control logic 211 is coupled to the potentiometer logic 193, to a mode control logic 213, and the timing control 215. The power control logic 211 receives a bond cycle signal and a channel 1 signal from the logic 215 and the pot logic 193 generates the CH1 and CH2 signals. The bond cycle signal is a square wave timing pulse which determines the time period of the bonding cycle to produce an output for controlling the timing of logic 193. During the next bond cycle, the transducer is used to make another bond.

In order to weld or bond with channel 2, a minus (not) CH1 is applied to switch 191S to allow the output of the pot logic 220 to be applied to potentiometer 196 for producing an output for application to the pot logic 196. Adjustment of the logic 220 is carried out in the same manner as adjustment of the logic 219. The CH2 signal and the up/down signal from pot logic 193 are applied to pot 133 for producing a constant output on channel 2 to the transducer in the same manner as described with respect to channel 1.

Channel 1 and channel 2 may be used for bonding on the substrate of the IC. The sensitivity of the substrate of the IC requires control of the energy applied during bonding due to the silicon or gallium oxide which requires the bonding to be controlled as much as possible compared to a bond in the substrate of the carrier which may be gold plated ceramic or silver plated lead frame materials which have no active elements beneath or within the carrier that can be damaged. On the substrate of the IC there are active elements such as diodes that can be easily damaged and hence controlled bonding is required.

Thus the power supply of the invention measures the current and voltage delivered to the transducer while the transducer is in contact with the bond wire and the bond pad and is actually making the bond and calculates the power being sent to the transducer. This power is compared to a preset valve and is used to maintain the input to the transducer constant. This is done at one point during each bond cycle. This is important since the transducer is sensitive to the force exerted on the bond pad as well as temperature and clamping forces. Thus sensing the precise condition while the bonding takes place accurately provides the feedback necessary to maximize the repeatability of the bond parameters. It has been demonstrated that measurement of the input power is the best measure of the power going into the bond itself. Thus the invention measure the current and voltage of the energy being delivered to the transducer during each cycle; calculates the power; and uses the power to correct the level of the power going to the transducer before the next bond is made.

The circuit of the invention thus maintains the power to the transducer, when channel 1 or channel 2 is being used for bonding as close as possible to the preset power and avoids changes in the power to the transducer which may occur during bonding for the reasons set forth above or if for example, the transducer happens to detect something that is much hotter or some surface that is very soft that can cause mechanical changes to the transducer that can translate into an impedance variation or a decrease in the current that is going to the transducer.

The real time dynamic bonding transducer power control is applicable to both ball and wedge bonding procedures.

Referring to the other components of the circuit of FIG. 2, the power on reset 221 resets all of the logic when the power to the system is turned on. It resets all of the circuits and allows them to re-establish the correct power lever, resets all of the logic, and initiates the calibrating process. The calibrating process sweeps the frequency across the transducer to determine where the transducer previously was with respect to frequency and locks the power supply to the correct transducer frequency. The power reset is coupled by way of lead 222 to a manually operated calibrate switch 223. When the switch 223 is closed, the system will automatically go through the calibration procedure.

The power supply is controlled by external signals which tell the power supply when to start to bond and when to trigger channel 1 and when to trigger channel 2. These signals come from another machine and can be very noisy electrically. The isolators 231, 233, and 235 isolate the power supply from the noise from the external machines.

The timing control & control logic system 215 and the mode control logic 213 provides all of the timing signals to leads 215A-215(I) to control the power supply. The systems 213 and 215 are formed of commercially available circuits. The timing sequence is programmed in the systems 213 and 215. A portion of the timing sequence is shown in FIG. 5.

As shown in FIGS. 4A and 4B the lead 215A is connected to a sync logic 241 which synchronizes the ultrasonic signal to the logic signal so that they occur at the same time. Voltage from lead 161 and current from the output of the differential amplifier 167 are amplified by amplifiers 243 and 245 and applied to the syn logic 241. The voltage and current are synchronized to the logic signal and fed to a phase detector 251 by way of leads 251A and 251B. The phase detector compares the relative phase of the voltage to the current and produces a phase error signal. It is high if the voltage leads the current and low if the voltage lags the current. The phase error signal is applied to the frequency calibration circuit 261 and to a two stage filter 263. The phase error signal is used to maintain the frequency of the VCO to that of the transducer. The circuit 261 uses the error signal during the calibration process. The phase error signal is a square wave. The filter 263 filters the square wave to a DC signal which is applied to the VCO by way of switch 265. When the VCO is first turned on, the filter is in a slower condition than when the VCO is in operation. The error signal applied from the filter 263 to the voltage controlled oscillator controls the frequency of the oscillator 121 which in turn controls the frequency of the voltage to the transducer and maintains the frequency of the power supply locked to the frequency of the transducer. For example, if there is a minus phase difference wherein the voltage lags the current, the phase error signal increases the frequency of the VCO which causes the phase difference to decrease. Conversely, if there is a plus phase difference wherein the voltage leads the current, the phase error signal decreases the frequency of the VCO which causes the phase difference to increase. The system of the invention is adjusted in order to obtain a constant phase shift between the voltage and the current.

The frequency calibrate circuit 261 initializes all of the frequency control components and circuits in the power supply. It compensates for temperature drift, etc. Its output goes by way of lead 264 to the calibrate switch 265 and by way of lead 266 to 1 a digital potentiometer 267 used for calibration purposes. The digital potentiometer 267 changes the resistance which changes the frequency which calibrates the VCO 121 to the resonant frequency of the transducer. During calibration, 2.75 volts DC is used as a reference by switch 265. When in the automatic calibration mode, the switch 265 switches to 2.75 voltage to use an error voltage of 2.75 volts which is about midway between the upper and lower values of the error signal which varies between zero and five volts.

All of the circuitry is inside the controller so that even though there is error one does not see the error since it is inside of the controller. The system thus is a real time controller and the system keeps a very tight control of the shift in the frequency, voltage and current to maintain a very tight control over these parameters. Thus during the bonding cycle, these features can be monitored to guarantee repeatability.

The standby timer 271 allows the power supply to go to a standby mode when it is not being used for bonding and displays the power the operator wants to bond at on the meter 181.

The mode control logic 213 is used also to determine manually whether channel 1 or channel 2 is to be tested. This can also be done automatically.

Elements 273 and 275 are manually operated potentiometers for use for controlling the duration of the CH1 and CH2 signals. Switch 277 is employed to select channel 1 or channel 2 for test purposes. Normally channel 2 is selected. An APC signal and a CH1 signal tells the switch 277 to select channel 1 for test purposes during calibration.

The timing signal D200US is a 200 microsecond delay which goes to the two stage loop filter 263. The busy signal goes outside to the output isolators.

The mode control logic allows the system to be switched to an automatic mode where a computer takes care of all of the timing and control or to a manual control where the operator operates all of the switches from the outside. The mode control 213 also determines whether channel 1 or channel 2 is selected during testing.

We claim:

1. A method of bonding a metal member to a metal bond site with the use of an ultrasonic transducer having an electrically activated vibrating means for vibrating said transducer, comprising the steps of:

contacting said transducer with said metal member while said metal member is engaging said bond site, applying an output voltage to said electrically activated vibrating means for vibrating said transducer at ultrasonic frequency for causing said metal member to bond to said bond site, obtaining voltage and current functions from said output voltage while bonding is being carried out and deriving a power function from said voltage and current functions, comparing said power function with a preset voltage function to obtain a correction function, and using said correction function to maintain the level of said output voltage substantially constant while bonding is being carried out.

2. A method of bonding a metal member to a metal bond site with the use of an ultrasonic transducer having an electrically activated vibrating means for vibrating said transducer, comprising the steps of:

contacting said transducer with said metal member while said metal member is engaging said bond site, applying an output voltage to said electrically activated vibrating means for vibrating said transducer at ultrasonic frequency for causing said metal member to bond to said bond site during a given cycle, during the initial part of said cycle, applying a higher output voltage to said electrically activated vibrating means than during the remaining part of said cycle wherein bonding is carried out at least during the remaining part of said cycle, obtaining voltage and current functions from said output voltage during the remaining part of said cycle while bonding is being carried out and deriving a power function from said voltage and current functions, comparing said power function with a preset voltage function to obtain a correction function, and using said correction function to maintain the level of said output voltage substantially constant while bonding is being carried out during the remaining part of said cycle.

3. A method of bonding a metal member to a metal bond site with the use of an ultrasonic transducer having an electrically activated vibrating means for vibrating said transducer, said transducer being of the type of having a mechanical lag following application of a voltage to said electrically activated vibrating means, comprising the steps of:

contacting said transducer with said metal member while said metal member is engaging said bond site, applying an output voltage to said electrically activated vibrating means for vibrating said transducer at ultrasonic frequency for causing said metal member to bond to said bond site during a given cycle, during the initial part of said cycle, applying a higher output voltage to said electrically activated vibrating means than during the remaining part of said cycle wherein bonding is carried out at least during the remaining part of said cycle, said higher output voltage being applied to said electrically activated vibrating means during the initial part of said cycle to compensate for the mechanical lag of said transducer to allow said transducer to reach maximum power in a shorter time period, while bonding is being carried out during the remaining part of said cycle, maintaining the level of said output voltage substantially constant.

4. The method of claim 3, wherein:

a power supply and a switching system are provided with said power supply having an output means coupled to said electrically activated vibrating means, operating said power supply to apply said higher output voltage to said output means from said power supply during the initial part of said cycle and then actuating said switching system to apply said substantially constant output voltage to said output means during the remaining part of said cycle.

* * * * *